(12) United States Patent
Yue et al.

(10) Patent No.: US 7,783,961 B2
(45) Date of Patent: Aug. 24, 2010

(54) RATE-COMPATIBLE LOW DENSITY PARITY CHECK CODING FOR HYBRID ARQ

(75) Inventors: Guosen Yue, Plainsboro, NJ (US);
Xiaodong Wang, New York, NY (US);
Mohammad Madihian, Plainsboro, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 406 days.

(21) Appl. No.: 11/174,043

(22) Filed: Jul. 1, 2005

(65) Prior Publication Data
US 2007/0022362 A1    Jan. 25, 2007

(51) Int. Cl.
*H03M 13/03* (2006.01)
(52) U.S. Cl. .................. 714/790; 375/225; 708/531
(58) Field of Classification Search ................ 714/790, 714/704; 375/225; 708/531
See application file for complete search history.

(56) References Cited

U.S. PATENT DOCUMENTS

| | | | |
|---|---|---|---|
| 6,233,717 B1* | 5/2001 | Choi | 714/805 |
| 6,633,856 B2* | 10/2003 | Richardson et al. | 706/15 |
| 6,842,872 B2* | 1/2005 | Yedida et al. | 714/703 |
| 7,185,270 B2* | 2/2007 | Shen et al. | 714/801 |
| 2001/0055320 A1* | 12/2001 | Pierzga et al. | 370/480 |
| 2006/0107192 A1* | 5/2006 | Mantha et al. | 714/800 |
| 2006/0156181 A1* | 7/2006 | Ha et al. | 714/758 |
| 2006/0179401 A1* | 8/2006 | Nefedov | 714/800 |

OTHER PUBLICATIONS

Yadzani, M.R., On construction of rate-compatible low-density Parity-check codes, 2004, IEEE, vol. 8, pp. 159-160.*

* cited by examiner

*Primary Examiner*—Scott T Baderman
*Assistant Examiner*—Enam Ahmed
(74) *Attorney, Agent, or Firm*—Joseph Kolodka

(57) ABSTRACT

A new rate compatible coding approach is disclosed herein which takes advantage of the structure of irregular repeat accumulate (IRA) type codes, a special class of low density parity check codes.

13 Claims, 11 Drawing Sheets

(A)

(B)

(C)

RATE-COMPATIBLE LOW DENSITY PARITY CHECK CODING FOR HYBRID ARQ

BACKGROUND OF INVENTION

The invention relates generally to digital data communication systems and more particularly to coding techniques for addressing transmission errors in such systems.

There are basically two approaches to controlling transmission errors in digital data communication systems: automatic repeat request (ARQ) and forward error correction (FEC). Although ARQ schemes offer high system reliability, they also are subject to poor throughput with increasing channel error rates, such as in a wireless communication channel. FEC schemes offer the possibility of constant throughput but with less reliability than ARQ schemes. Various schemes have been proposed which combine the two approaches, typically referred to as "hybrid" ARQ techniques, in which some form of coding technique is utilized at the transmitter and receiver, and decoding errors trigger retransmission requests.

An advantageous coding technique which proves to be very useful when utilized with hybrid ARQ is what is referred to in the art as "rate compatible" coding. Rate compatible codes are a family of nested error correction codes where the codeword bits from higher rate codes are embedded in the lower-rate codes. Thus, a hybrid ARQ scheme can achieve incremental redundancy by having a transmitter send the higher-rate coded bits first and send additional parity bits later if required from the receiver. There are two basic approaches to obtaining rate compatible codes—one is by "puncturing" code bits in a low-rate mother code to obtain a higher rate code; the other is by "extending" a high-rate mother code to lower-rate codes by appending more parity bits. Rate compatible codes were first introduced using puncturing on convolutional codes. See J. Hagenauer, "Rate Compatible Punctured Convolutional Codes (RCPC codes) and their Applications," IEEE Trans. Commun., Vol. 36, No. 4, pp. 389-400 (April 1988). Recently, attempts have been made to design rate compatible codes for what are known in the art as low density parity check (LDPC) codes. See, e.g., J. Li and K. Narayanan, "Rate-Compatible Low-Density Parity Check Codes for Capacity-Approaching ARQ Schemes in Packet Data Communications," in Proc. Int. Conf. Commun., Internet, and Inform. Techn. (CIIT) (Nov. 2002). LDPC codes are attractive because they offer good performance while enjoying lower decoding complexity. A puncturing approach for irregular LDPC codes has been proposed which optimizes the degree profiles of an LDPC code ensemble based on density evolution analysis. See J. Ha and S. McLoughlin, "Optimal Puncturing of Irregular Low-Density Parity-Check Codes," in Proc. IEEE Int. Conf. Commun. (ICC), pp. 3110-14 (May 2003). While showing good puncturing profiles that approach capacity, the results presume an infinite codeword length, which might not be suitable for design of rate compatible LDPC with short block length. Recently, a new puncturing approach has been proposed specifically for finite-length LDPC which is based on grouping nodes with different recoverable steps. See J. Ha and S. McLaughlin, "Puncturing for Finite Length Low-Density Parity-Check Codes," in Proc. IEEE Int. Symp. Inform. Theory (ISIT), p. 151 (June 2004).

SUMMARY OF INVENTION

A new rate compatible coding approach is disclosed herein which takes advantage of the structure of irregular repeat accumulate (IRA) type codes, a special class of low density parity check codes. A wide effective code rate range is achieved by using a hybrid approach of generating high-rate codes with a novel puncturing technique and generating low-rate codes with a novel extending technique. In accordance with an aspect of the invention, higher-rate codes are generated by deliberately puncturing the parity nodes in an advantageous mother code up to the highest desired code rate. The other higher code rates are obtained by "unpuncturing" these parity nodes, preferably in a gradual controlled manner that takes into account the number of recoverable steps for the parity nodes. The parity nodes can be grouped based on recoverable steps, and parity nodes with a maximum recoverable step can be unpunctured first with priority given to those consecutive parity nodes with a maximum recoverable step. In accordance with another aspect of the invention, the lower-rate codes can be generated by extending the mother code with mixed degree-1 and degree-2 parity nodes. An arrangement which optimizes the proportion between degree-1 and degree-2 parity nodes is also disclosed.

The rate compatible codes generated by the above techniques provide good error correction performance over a wide effective range of code rates. The codes also can achieve high throughput with a hybrid ARQ scheme in a large region of signal-to-noise ratios. Moreover, the coding techniques can be implemented with a simple encoder and a low-complexity decoder. These and other advantages of the invention will be apparent to those of ordinary skill in the art by reference to the following detailed description and the accompanying drawings.

DETAILED DESCRIPTION

Figure 1:
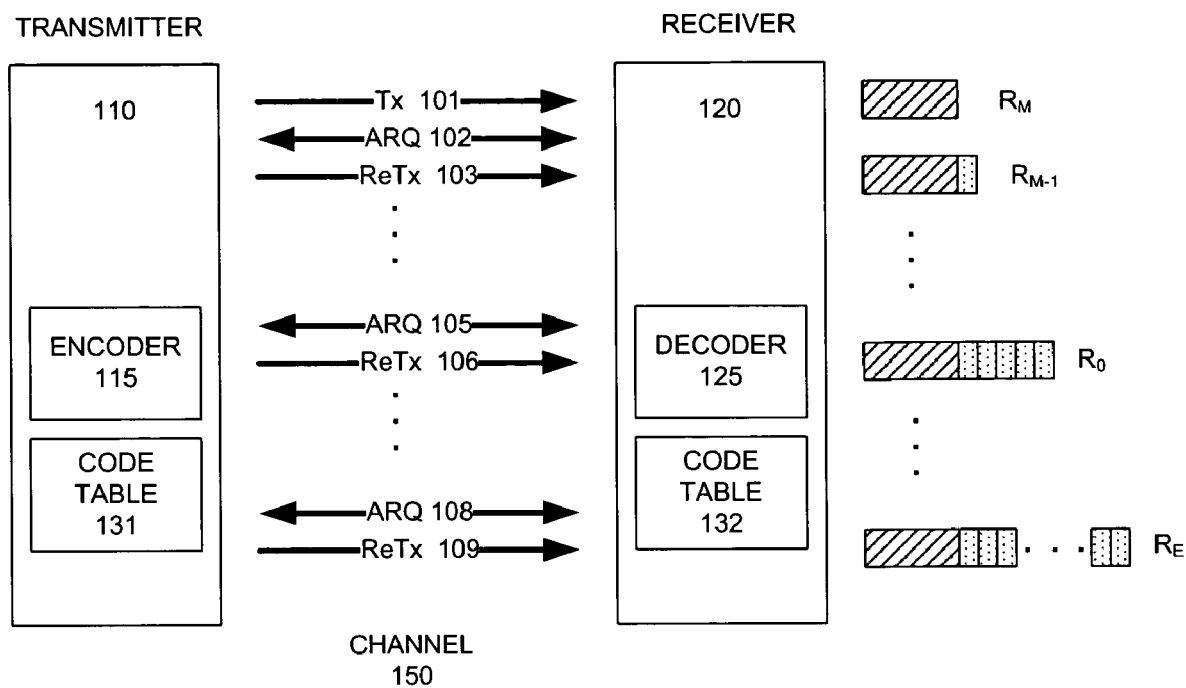
FIG. 1 is a diagram of an illustrative wireless system, suitable for practice of an embodiment of the invention.

FIG. 1 is a diagram of an illustrative wireless system 100, suitable for practice of an embodiment of the present invention. The system comprises a transmitter 110 and a receiver 120, each of which can include one or more transmit/receive antennas which operate across a wireless channel 150. The transmitter 110 includes an encoder 115 and the receiver 120 includes a decoder 125. The encoder 115 and the decoder 125 operate in accordance with a rate compatible code as reflected in FIG. 1 by codes tables 131 and 132. The construction and the operation of the rate compatible code is described in further detail herein.

As depicted in FIG. 1, the wireless system 100 employs a "hybrid" automatic repeat-request (ARQ) arrangement. At 101, the transmitter 110 sends data which has been encoded by the encoder 115 using a high rate $R_M$ code of the rate compatible code. The receiver 120 tries to decode the data using its decoder 125. The receiver 120 communicates its decoding success or failure with the transmitter 110 through an advantageous ARQ protocol at 102, e.g., through acknowledgment messages. If the receiver 120 fails to recover the information, the transmitter 110 at 103 sends a partial redundancy of the initial coded data in the form of parity bits. The encoder 115 and the decoder 125 use a rate compatible code, and, thus, the combination of the original coded data and the additional parity bits at the decoder 120 form a message coded at a lower rate $R_{M-1}$. If the receiver 120 again fails to recover the information, the transmitter 110 can continue to send incremental redundancies upon request until all of the redundancies are used up and the lowest rate code $R_E$ is utilized. The rate compatible codes, thus, form a family of nested error correction codes where the codeword bits from higher rate codes are embedded in the lower rate codes.

Figure 2:
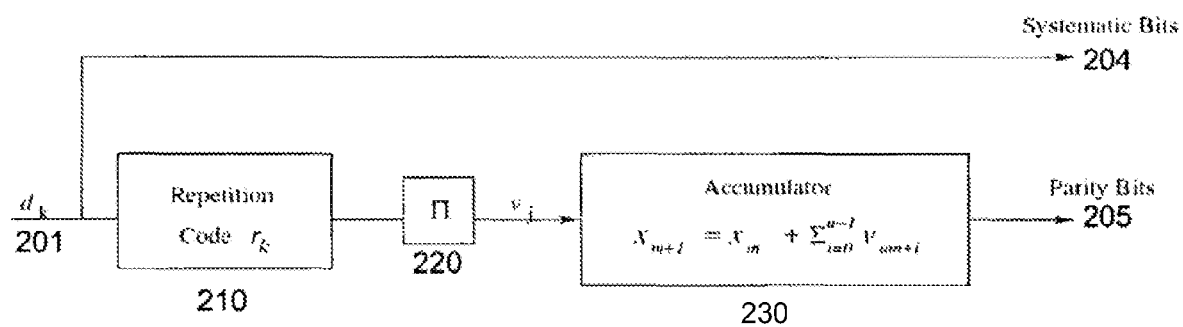
FIG. 2 illustrates an encoder structure, suitable for practice of an embodiment of the invention.

The encoder 115 and the decoder 125 preferably use rate compatible codes based on irregular repeat accumulate (IRA) coding. FIG. 2 shows a schematic diagram of an illustrative IRA encoder. A block of information bits $\{d_k\}$ 201 are encoded by an irregular repeat code at 210. The repetition degrees of $\{d_k\}$ are denoted by $\{r_k : 2 \leq r_k \leq D\}$, where D is the maximum repetition degree. The repeated bits are interleaved at 220 to obtain $\{u_j\}$, and then encoded by an accumulator 230, given by $$x_{m+1} = x_m + \sum_{i=0}^{a-1} u_{am+i}, \quad m = 0, \ldots, M-1 \tag{1}$$

where $x_m$ represents parity nodes with initial setting $x_0=0$; a is the grouping factor. The length of the parity bits is M=n/a, where $n=\Sigma_{k=1}^{K} r_k$. The final coded bits $\{b_i\}_{i=1}^{N}$ are the collection of the information bits $\{d_k\}_{k=1}^{K}$ 204 and the parity bits $\{x_m\}_{m=1}^{N-K}$ 205.

Figure 3:
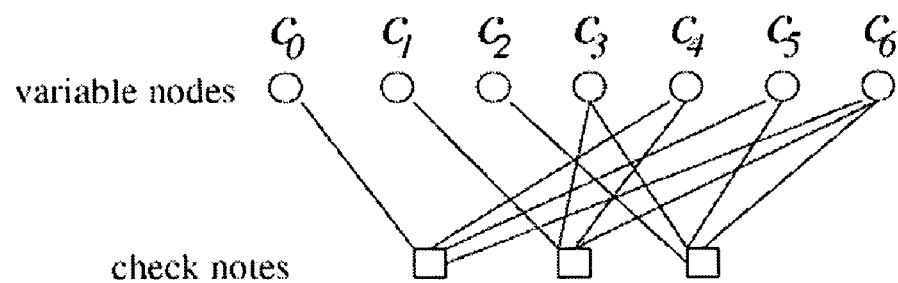
FIGS. 3A and 3B illustrate different representations of a low density parity check code.
FIG. 3C shows a bipartite graph for a general low density parity check code.
Figure 3:
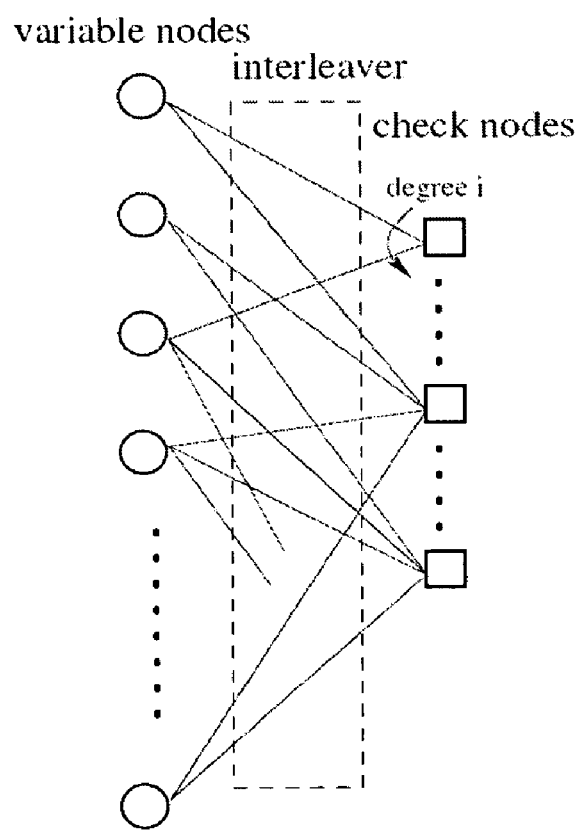

IRA codes are a special class of what are referred to as low density parity check (LDPC) codes. An LDPC code is a linear block code specified by a very sparse parity check matrix H, such as the one depicted in FIG. 3A. The code can also be represented by a bipartite graph consisting of two types of nodes—variable nodes and check codes, as shown in FIG. 3B. Each code bit is a variable node while each parity check or each row of the parity check matrix represents a check node. An edge in the graph is placed between variable node i and check node j if $H_{j,i}=1$. That is, each check node is connected to code bits that satisfy the single parity check (SPC) constraint. The LDPC codes are specified by two polynomials $$\lambda(x) = \sum_{i=1}^{d_{l_{max}}} \lambda_i x^{i-1} \text{ and } \rho(x) = \sum_{i=1}^{d_{r_{max}}} \rho_i x^{i-1},$$

where $\lambda_i$ is the fraction of edges in the bipartite graph that are connected to variable nodes of degree i, and $\rho_i$ is the fraction of edges that are connected to check nodes of degree i. The degree profiles $\{\lambda_i, \rho_i\}$ of LDPC codes can be optimized to have capacity approaching performance for long codes. A general bipartite graph for an LDPC code is depicted in FIG. 3C. Based on the Tanner graph representation, the LDPC codes can be decoded using iterative message-passing algorithm.

Figure 4:
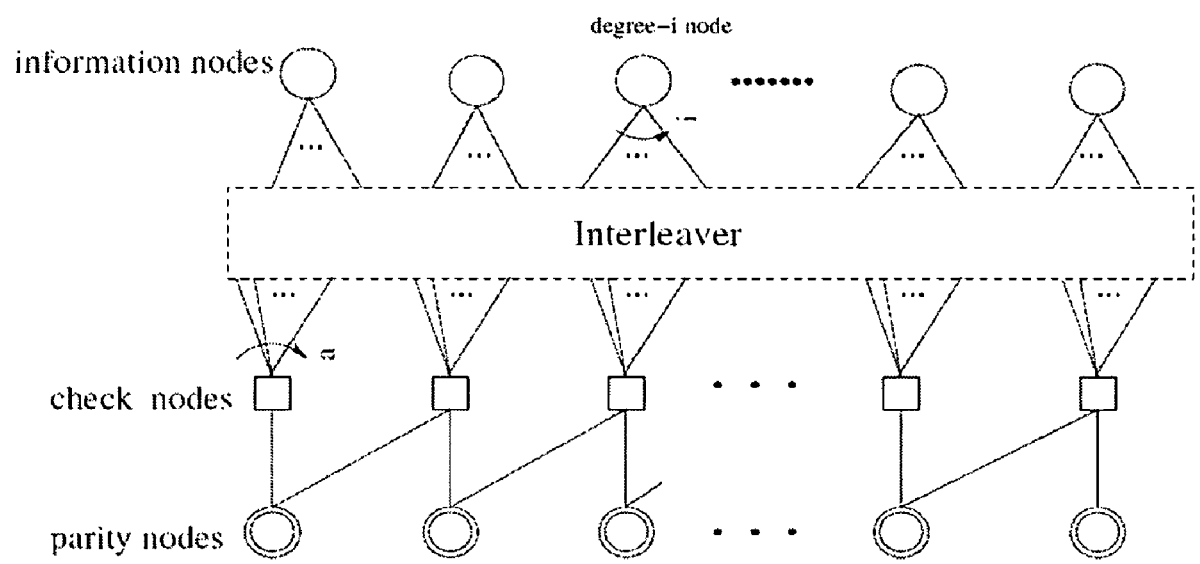
FIG. 4 is a bipartite graph representation of an IRA code.

Similar to LDPC codes, one can represent the IRA codes by a Tanner graph, shown in FIG. 4. The IRA code ensemble is formed by all graphs of the form of FIG. 4. Note that $n=\Sigma_{k=1}^{K} r_k$ is the total number of edges connecting the information bit nodes and the check nodes. Define $\lambda_i$ as the proportion of the edges connected to the information bit nodes with degree i, i=2, ..., D, which satisfies $\Sigma_{i=2}^{D} \lambda_i = 1$. The rate of the codes is then given by $$R = \frac{K}{K+M} \tag{2}$$

$$= \frac{n \sum_i \lambda_i / i}{n \sum_i \lambda_i / i + \sum_i \lambda_i n / a}$$

$$= \frac{a \sum_{i=2}^{D} \lambda_i / i}{1 + a \sum_{i=2}^{D} \lambda_i / i}.$$

We use a polynomial to represent the repetition profile of an IRA code ensemble, i.e., $$\lambda(x) = \sum_{i=2}^{D} \lambda_i x^{i-1}. \tag{3}$$

As shown in the Tanner graph of an IRA code in FIG. 4, the check nodes are single parity check constraints for the information nodes along a interleaved edges plus 2 parity nodes from the accumulator outputs. Thus, the check nodes in an IRA code are the same as the check nodes in an LDPC code with degree a+2. The parity nodes of an IRA code can be viewed as degree-2 variable nodes in an LDPC code. The information bit nodes of an IRA code are also viewed as LDPC variable nodes with the same degree as they are in an IRA code. Therefore, IRA codes are indeed a special class of LDPC codes with semi-determined structure. Therefore, one can use the message-passing decoding algorithm which is similar to the LDPC decoding algorithm to decode the IRA codes.

In accordance with a preferred embodiment of the invention, rate compatible LDPC codes are obtained by using puncturing and extending in a hybrid-approach. The puncturing approach is used to obtain the medium to high-rate codes while the extending approach is used to obtain the medium to low-rate codes. The specific details of the puncturing approach and the extending approach are described below. When generating an initial LDPC code, it is advantageous to use the design technique disclosed in co-pending commonly-assigned U.S. patent application Ser. No. 11/095,160, entitled "METHOD FOR CONSTRUCTING FINITE-LENGTH LOW DENSITY PARITY CHECK CODES," filed on Mar. 31, 2005, the contents of which are incorporated by reference herein. One can obtain good finite LDPC codes with medium rate, for instance, R=0.5, and use it as the mother code with which we consider the design of RC-LDPC codes next.

PUNCTURING. Puncturing has been widely used in convolutional, BCH, and turbo codes to obtain rate compatibility.

With puncturing, the encoder generates all the parity bits (whole codeword), but only partial bits are transmitted. The parity coordinates that are not transmitted can be viewed as punctured. With proper puncturing, a set of higher rate codes are obtained from a low-rate mother code. In the decoder, the punctured bits are inserted as erasures and the decoding algorithm is performed as in a non-punctured codeword, i.e., the mother code. For LDPC codes, puncturing can be viewed as the deletion of the columns in the parity check matrix.

Figure 5:
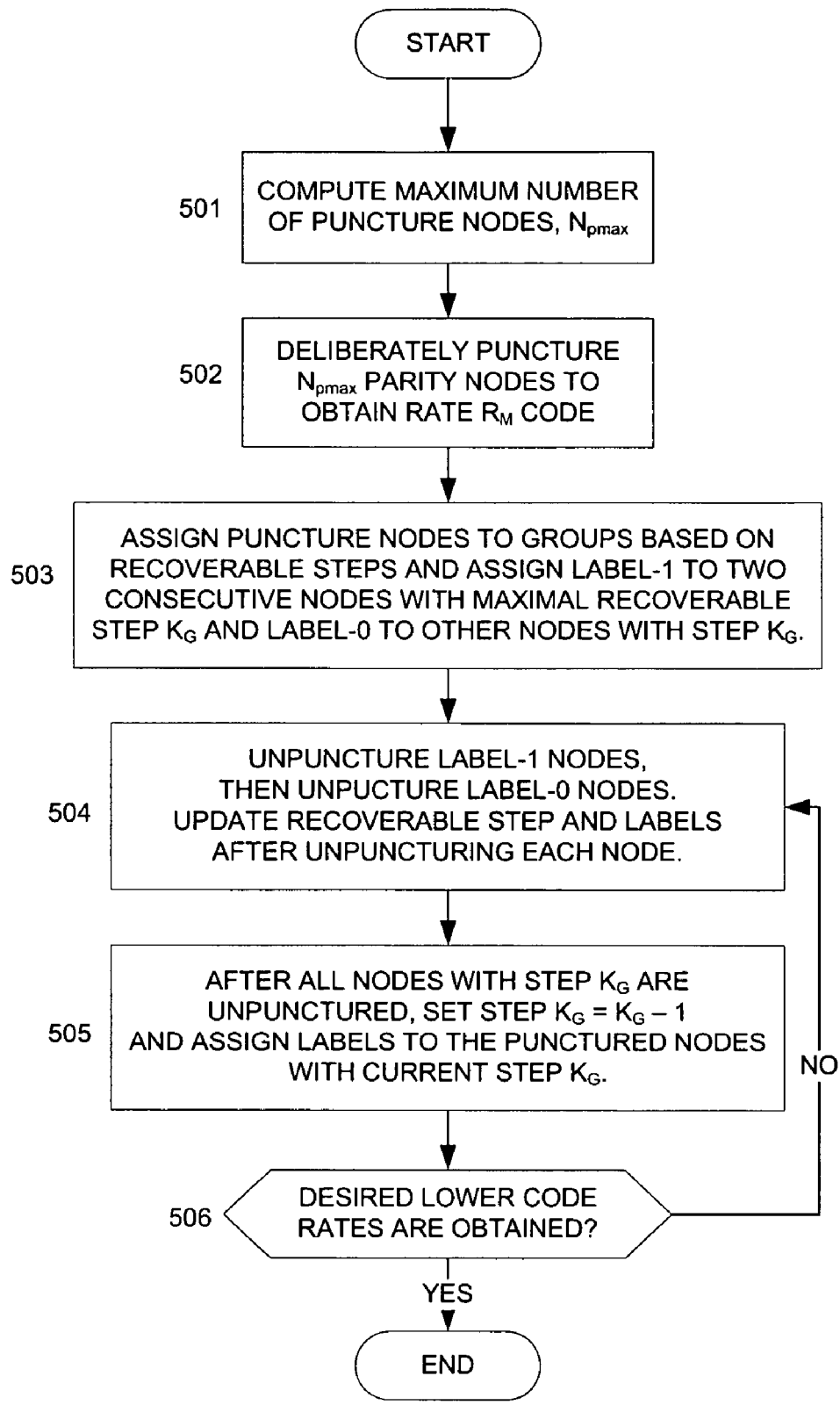
FIG. 5 is a flowchart illustrating a puncturing approach, in accordance with an embodiment of an aspect of the invention.

FIG. 5 is a flowchart of processing performed in puncturing an IRA-type LDPC code to obtain rate compatibility, in accordance with an embodiment of an aspect of the invention.

At step 501, the maximum number of puncture nodes, $N_{p_{max}}$, is computed. Given codes rates of RC-LDPC codes $R_0, \ldots, R_M$, where $R_0$ is the rate of mother code and $R_M$ is the highest rate of RC-LDPC that we want to achieve by puncturing, the maximum number of punctured node is then $$N_{p_{max}} = N_0(1 - R_0/R_M), \quad (4)$$

where $N_0$ is block length of the mother code.

Figure 6:
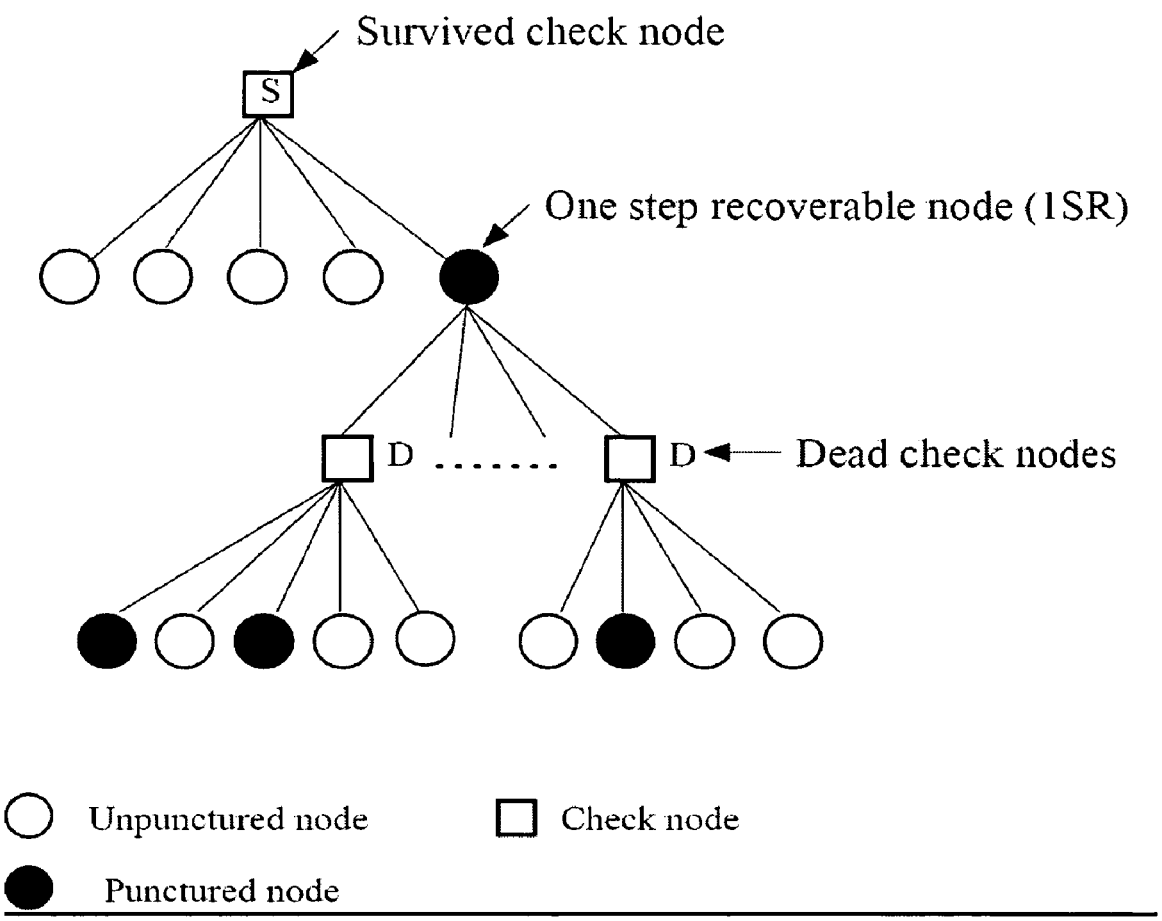
FIG. 6 is a diagram illustrating various useful definitions.

The puncture nodes can be grouped into different groups. If a check node has only one punctured node, the check node can be referred to as a "survived" check node (or a one-step survived check node), and the punctured node which has at least one survived check node connected is referred to as a "one step recoverable" (1SR) node. This is depicted in FIG. 6. A check node having two punctured variable nodes connected is then a dead node. The 1SR nodes can be recovered during the first iteration of an iterative message-passing decoder on binary erasure channels (BEC). On AWGN channels, the 1SR nodes may not be recovered but will have messages with a certain reliability from the SPC decoding. For the sake of simplicity, it will still be referred to as recovered for the punctured nodes on AWGN channels. If a variable node has at least one survive check node neighbor that has at least one (k−1)SR node and others are mSR nodes, where $0 \leq m \leq k-1$, this variable node is then called a "k step recoverable" node (kSR). Thus, all punctured nodes can be grouped into different groups, the group $G_k$, $k=1, \ldots, K_G$, consisting of all the kSR punctured nodes. It is assumed that a $k_1$SR node has a more reliable message from a survived check node at the $k_2$th iteration if $k_1 < k_2$, and a kSR node connected with more survived check nodes will be recovered with a more reliable message. The expression $$\sum_k |G_k| \geq N_{p_{max}} \quad (5)$$

represents a constraint on puncturing.

At step 502, the $N_{p_{max}}$ parity nodes are "deliberately" punctured to obtain the RC-LDPC code of rate $R_M$. The notion of "deliberate" puncturing is described below. The parity nodes are punctured based on the criterion of minimizing the maximal step recoverable punctured nodes.

At step 503, the punctured nodes of recoverable step k are assigned to group $G_k$, $k=1, \ldots, K_G$. Also, assign the label-1 to two consecutive nodes with maximal recoverable step, $K_G$, and label-0 to other nodes with step $K_G$.

At step 504, the punctured nodes are then "unpunctured" to obtain the lower code rate gradually. We first unpuncture the punctured node with the maximum recoverable step, $K_G$, and label-1 first. After using all the label-1 nodes in the group $G_{K_G}$, we then un-puncture the ones with label-0. Note that after unpuncturing each node, we update the recoverable step and labels for all rest punctured nodes.

At step 505, after all the nodes with step $K_G$ un-punctured, set step $K_G = K_G - 1$ and assign the labels to the punctured nodes currently with $K_G$.

Processing continues by unpuncturing the punctured nodes at steps 504 and 505 until, at step 506, all the desired lower code rate are obtained.

The puncturing approach depicted in FIG. 5 takes advantage of important features of IRA-type codes. First, in a systematic IRA code, one knows exactly which nodes are information nodes and what are parity nodes. During the decoding, the information nodes have to have more reliable messages. Secondly, it is seen from FIG. 4, the parity nodes are degree-2 variable nodes that are deterministically placed and connected to the check nodes in a zigzag shape.

With this feature, it can be shown that any parity nodes punctured can be recovered during a certain number of iterations if there is at least one unpunctured parity node and all the information nodes are not punctured. This can be readily verified. Consider FIG. 4, in which the check nodes at which the unpunctured node is connected are survived check nodes because all the information nodes are not punctured and they only have at most one punctured node connected, i.e., the node right at the left or right of unpunctured node. As long as the node at the left or right is punctured, it can be recovered in the first iteration. After these two punctured nodes are recovered, the one at the next left or right can be recovered in the next decoding iteration. Based on the above, it is thus reasonable to consider only puncturing the parity nodes, so that one can obtain highest recoverable rate K/(K+1), where K is the block length of information sequence.

Figure 7:
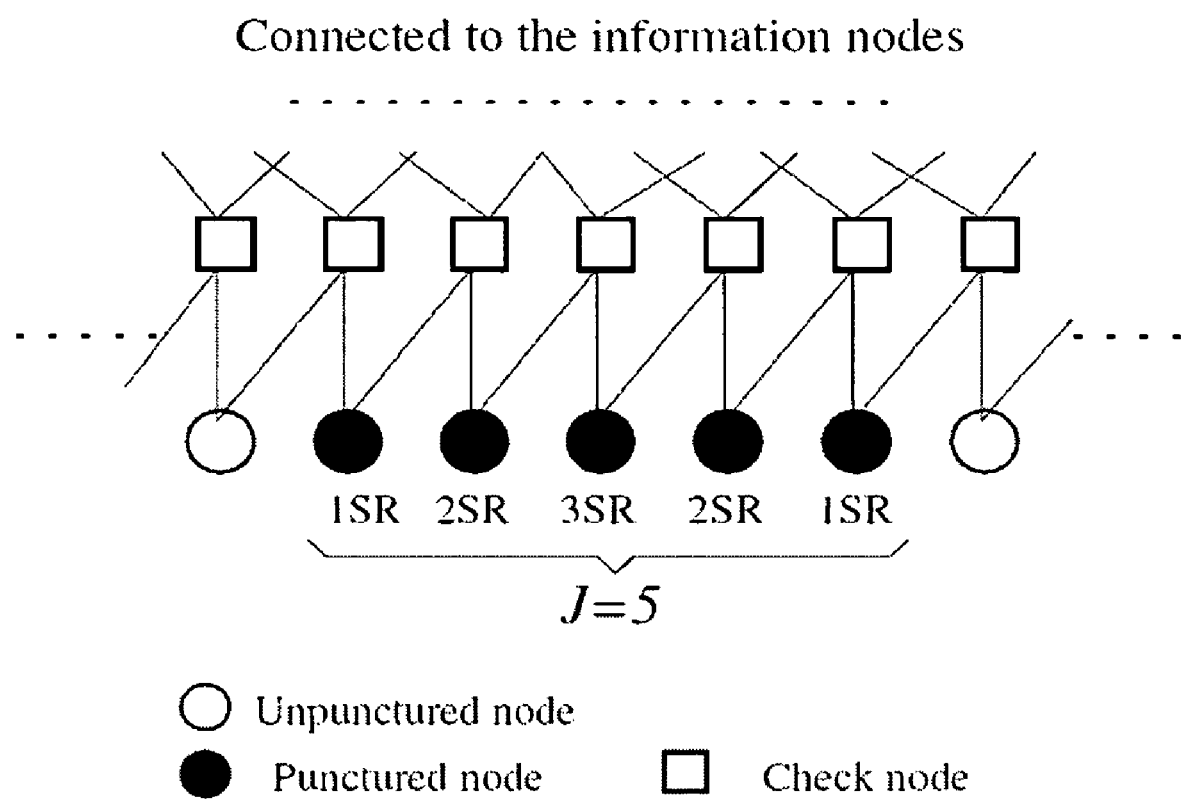
FIG. 7 is a diagram illustrating a pattern of punctured parity nodes in an IRA code.
Figure 8:
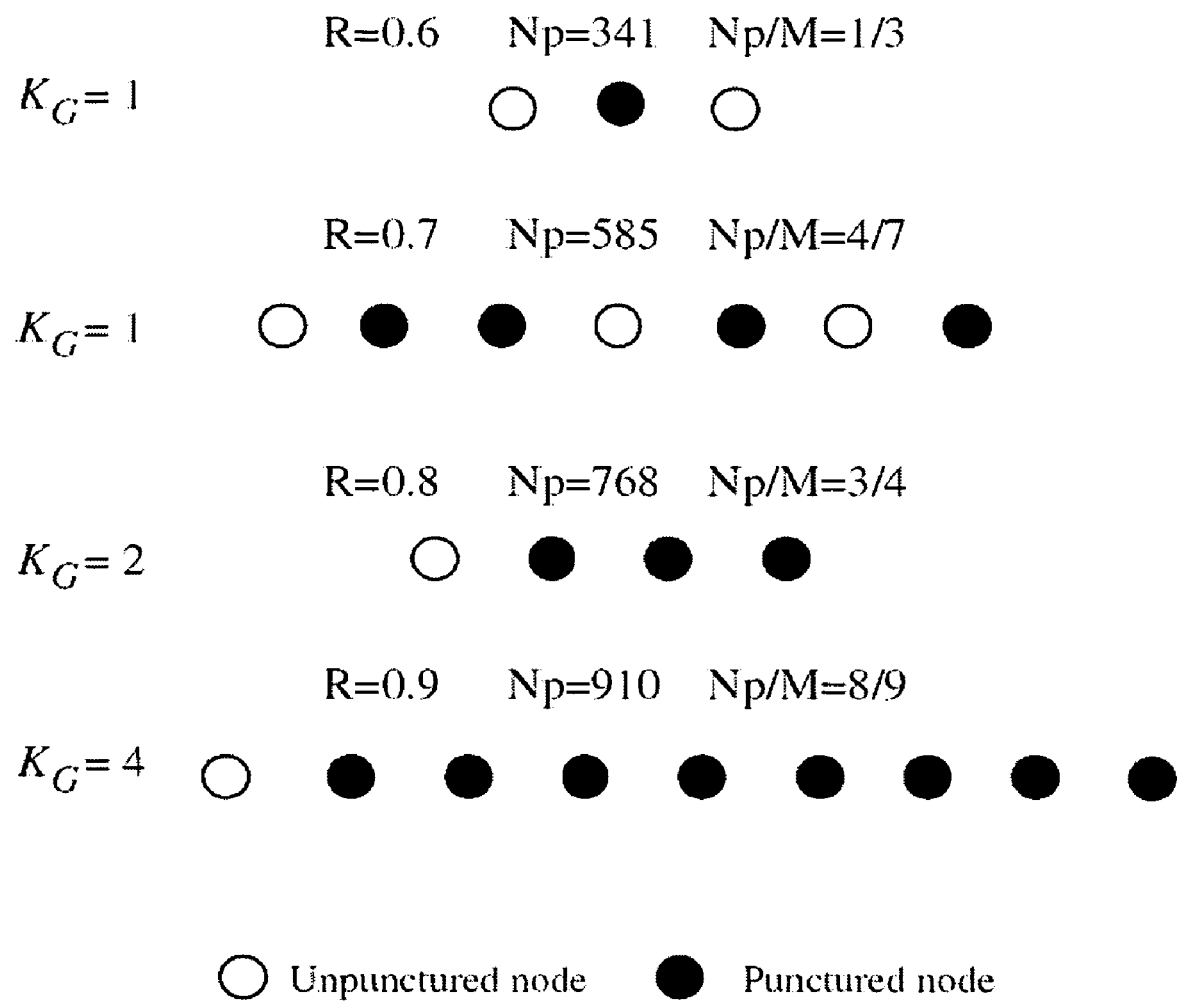
FIG. 8 is a diagram illustrating a deliberate puncturing pattern in an IRA code.

Next, consider the recoverable steps of the punctured parity nodes. FIG. 7 depicts a pattern of punctured parity nodes in an IRA code. Consider J consecutive punctured parity nodes shown in left part of FIG. 7. It is seen that the most left and right one are 1SR node, or denoted by 1SR, then second ones are 2SR. Then one knows the largest steps in J consecutive punctured nodes is $\lceil J/2 \rceil$. We find that it is the only pattern of punctured parity nodes in an IRA code so that the punctured nodes can be easily assigned to the group $G_k$ by $k = \min\{i, J+1-i\}$, where i is the index, start with 1 from one side of J consecutive punctured nodes. Hence, to puncture $N_p$ nodes to an IRA with M parity nodes the optimal solution to minimizing $K_G$ is evenly puncturing J consecutive nodes at the parity nodes if $J > 1$, where $J = \lceil N_p/(M-N_p) \rceil$. If there is a remainder in the division, there exist some J−1 consecutive puncture nodes. For J=1, one can simply place the $N_p$ punctured node evenly without consecutiveness. The inventors refer to this as deliberate puncturing. For instance, given a (N=2048, K=1024) IRA code as the mother code, the patterns of deliberate puncturing of different rate are shown in FIG. 8, where $N_p/M$ is the puncture rate over the parity nodes.

With deliberate puncturing, one can puncture any $N_p$ nodes to obtain optimal punctured IRA codes. However, they are are not rate-compatible. In order to get rate-compatibility, the puncturing approach illustrated by FIG. 5 proceeds in a reverse way, i.e., deliberately puncture the mother codes to the code with the highest rate $R_M$, then unpuncture those punctured nodes to obtain lower rate. The reason is that empirically one knows that the puncturing pattern is always more important to the higher rate RC codes. For instance, we have deliberately punctured codes in a pattern of J consecutive nodes, then $K_G = \lceil J/2 \rceil$. If we further puncture a parity node, it will form a streak of 2 J+1 consecutive punctured nodes. Then $K_G = J+1$. This large increased $K_G$ will significantly degrade the performance of the high rate code.

It can be shown that the above puncturing approach provides rate compatible IRA-type LDPC codes which provide good performance from medium to very high code rates. It should be noted that with the above puncturing approach, one can obtain the codes with continuous rates by unpuncturing the node one by one. One can pick any rates to form a set of RC-LDPC codes. One can also modify the unpuncture strategy above slightly for fixed discrete $R_i$s. The performance of resulting RC-LDPC codes, however, would not be much different.

It is useful to compare the above approach with the prior art puncturing approach disclosed in See J. Ha and S. McLaughlin, "Puncturing for Finite Length low density parity check Codes," in Proc. IEEE Int. Symp. Inform. Theory (ISIT), p. 151 (June 2004). While this prior art puncturing approach is also based on grouping nodes with different recoverable steps, it is focused on handling regular LDPC codes rather than irregular IRA-type LDPC codes. A greedy search algorithm is therein proposed to find the optimal set of groups $\{G_k\}_{k=1}^{K_G}$ from all variable nodes by minimizing $K_G$. After the set of $G_k$ are obtained, the puncturing is then performed by puncturing the nodes in $G_1$ first, after using up all nodes in $G_1$, then $G_2$, and $G_3$, ..., until all RC-LDPC codes with rate $R_1$, $R_2$, ..., $R_M$ are gradually obtained. With this puncturing algorithm, all the punctured nodes are recoverable (or having a reliable message instead of 0) after the $K_G$th decoding iterations.

EXTENDING. The rate compatible code disclosed above can be extended to lower rates by adding extra redundancy bits, as further described below. An advantage of extending is the reduction of complexity. Unlike puncturing, additional parity bits can be appended only when needed, and decoding is only performed for the bits transmitted. Therefore, unnecessary computations are avoided at the encoder and decoder. Since it is difficult to obtain a good high rate LDPC code due to the small size of the code graph, the mother code for extending is preferably of moderate rate.

Figure 9:
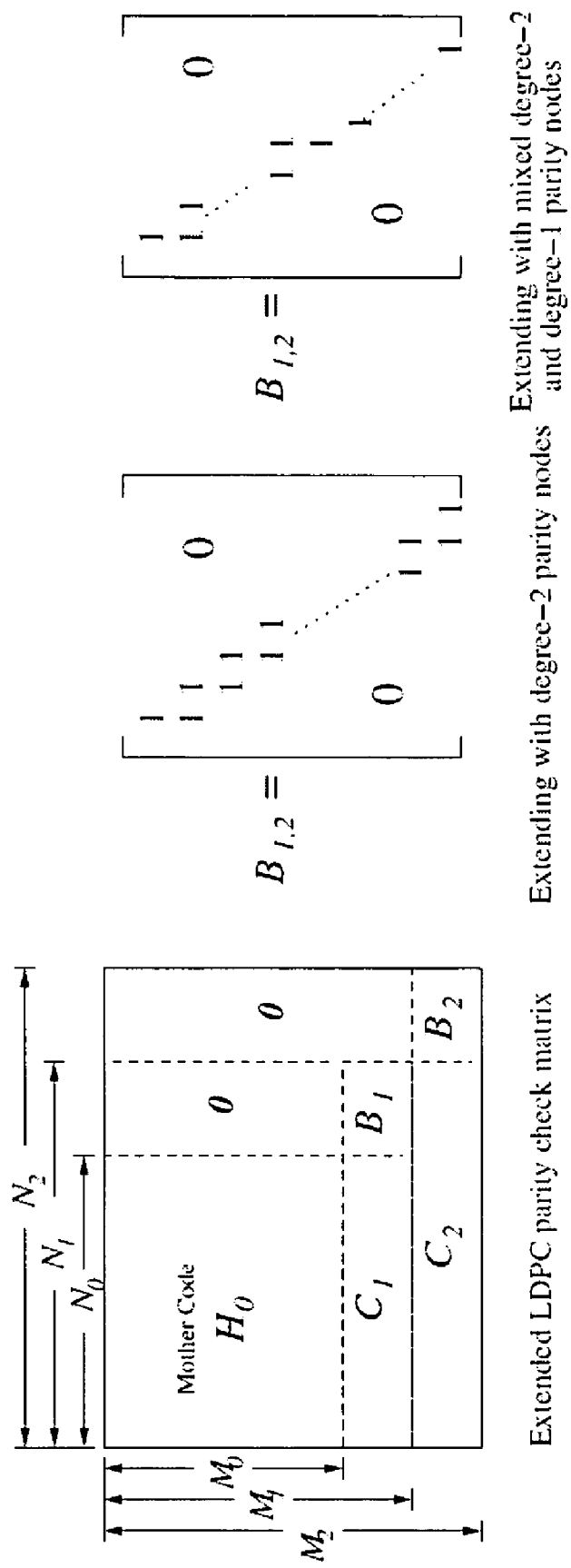
FIG. 9 is a diagram illustrating extension of a parity check matrix of an LDPC code.

FIG. 9 illustrates how new codes can be obtained by introducing additional bits and adding additional constraints (rows) for both the new and old nodes in the parity check matrix. For instance, new rows of $[C_1, B_1]$ and $[C_2, B_2]$ are included to obtain the rate $K_0/N_1$ and $K_0/N_2$. Because $N_2-M_2=N_1-M_1=K_0$, $B_1$ and $B_2$ are square and have full rank; $C_1$ and $C_2$ are sparse. The entries above $B_1$ and $B_2$ have to be zero to achieve rate-compatibility. The optimal profiles of $B_1$, $C_1$ and $B_2$, $C_2$ can be obtained through density evolution. For IRA codes, $B_1$ and $B_2$ represent the extended degree-2 parity nodes; thus, the extended matrices are fixed with two 1's in each column and placed in a stairway shape, as shown in FIG. 9. Therefore, only the columns in $C_{1,2}$ representing information bits contain nonzero entries; and we need to consider the design of these non-zero entries in $C_{1,2}$ to obtain good extended codes. There are two issues we may consider. First, the profiles of the extended code ensemble can be optimized. Second, the design of particular $C_{1,2}$ can be treated as finite-length code design to satisfy unequal protection of the coded bits with different types of cycles.

Define $$\phi(x) = 1 - E\left[\tanh\left(\frac{u}{2}\right)\right],$$

where $u \sim N(x, 2x)$, and $\phi(0)=1$. Based on density evolution analysis with Gaussian approximation, the iterative process of IRA decoding from the lth iteration to the (l+1)th iteration can be represented by $$r^{l+1} = h(s, r^l, \tilde{r}^l) \tag{6}$$

$$\text{with } h(s, r, \tilde{r}) = \sum_{i=2}^{D} \lambda_i h_i(s, r, \tilde{r}), \tag{7}$$

$$h_i(s, r, \tilde{r}) \triangleq \phi(s + (i-1)\phi^{-1}(1 - (1-r)^{a-1}(1-\tilde{r})^2)), \tag{8}$$

$$\text{and } \tilde{h}(s, r, \tilde{r}) \triangleq \phi(s + \phi^{-1}(1 - (1-r)^a(1-\tilde{r}))), \tag{9}$$

where i is the degree of information nodes; h (s, r, $\tilde{r}$) is the function of updating extrinsic messages from the check node to the information nodes, and $\tilde{h}$ (s, r, $\tilde{r}$) is the function of updating extrinsic message to the parity nodes; $s=4E_s/N_0$; r and $\tilde{r}$ are scalars of extrinsic messages passed between the information nodes and parity nodes, respectively. Then, the IRA code optimization for AWGN channel is to find the optimal code ensemble profile $\{\lambda_i, a\}$ which maximizes the code rate R and subject to the error-free decoding constraint, $r^{l+1} < r^l$, i.e., $$\underset{\{\lambda_i\}, a}{\text{maximize}} \; a \sum_{i=2}^{D} \lambda_i / i, \quad s.t. \; r > h(s, r, \tilde{r}(r)) \text{ and } \sum_{i=2}^{D} \lambda_i = 1, \tag{10}$$

where $\tilde{r}(r)$ denotes the solution of $$\tilde{r} = \tilde{h}(s, r, \tilde{r}), \tag{11}$$

for a given r. Note that the function $\phi(x)$ is monotonically decreasing. Then, given a fixed s, for all r∈[0, 1], the function $\tilde{h}(s,r,\tilde{r})$ is monotonically increasing with $\tilde{r}$. Since $\tilde{h}(s, r, 0) \geq 0$ and $\tilde{h}(s, r, 1) \leq 1$, (11) has a unique solution in (0,1).

If the group factor a is different for each step of extending, the check nodes may no longer be regular. Therefore, we define the distribution $\rho_a$ as the degree fraction of group factor a. We then rewrite equations (8) and (9) as $$h_i(s, r, \tilde{r}) \triangleq \phi\left(s + (i-1)\phi^{-1}\left(1 - (1-\tilde{r})^2 \sum_a \rho_a (1-r)^{a-1}\right)\right), \tag{12}$$

$$\text{and } \tilde{h}(s, r, \tilde{r}) \triangleq \phi\left(s + \phi^{-1}\left(1 - (1-\tilde{r}) \sum_a \tilde{\rho}_a (1-r)^a\right)\right), \tag{13}$$

where $\tilde{\rho}_a$ is the degree distribution from the node perspective. In order to obtain the profiles with rate compatibility, additional constraints are introduced. Given the profiles of the RC code of rate $R_q$ at the qth stage, $\{\lambda_{q,i}, \rho_{q,a}\}$, the constraints for next extended code ensemble, $\{\lambda_{q+1,i}, \rho_{q+1,a}\}$ of rate $R_{q+1}$, where $R_{q+1} < R_q$, can be obtained as follows.

Define the scaling factor $\beta_q = M_q/M_{q+1}$. We assume that the group factor remains the same in the matrix $C_q$ at the qth extension, denoted by $a_q$, for all $q=1, 2, \ldots$. The RC constraint for $\rho_{q+1,a}$ from a node perspective is given by $$\tilde{p}_{q+1,a} = \beta_q \tilde{p}_{q,a}, \text{ for } a \neq a_{q+1}, \quad (14)$$

$$\tilde{p}_{q+1,a} = 1 - (1 - \tilde{p}_{q,a})\beta_q, \text{ for } a = a_{q+1}, q = 1, 2, \ldots,$$

where $\tilde{p}_{q,a} = \dfrac{\rho_{q,a}/a}{\sum_j \rho_{q,j}/j}, \rho_{q,a} = \dfrac{\tilde{p}_{q,a} a}{\sum_j \tilde{p}_{q,j} j}$.

Since additional SPC constraints imposed for extending can possibly increase the degrees of information nodes, the constraints for the degree profiles from the node perspective are given by $$\sum_{i=k}^{D_{q+1}} \tilde{\lambda}_{q+1,i} \geq \sum_{i=k}^{D_q} \tilde{\lambda}_{q,i}, \text{ for } k = 2, 3, \ldots, \quad (15)$$

where $$\tilde{\lambda}_{q,i} = \dfrac{\lambda_{q,i}/i}{\sum_j^{D_q} \lambda_{q,j}/j}, \lambda_{q,i} = \dfrac{\tilde{\lambda}_{q,i} i}{\sum_j^{D_q} \tilde{\lambda}_{q,j} j},$$

With the above constraints, we can then obtain the optimal extending profiles using differential evolution for LDPC code design.

Figure 10:
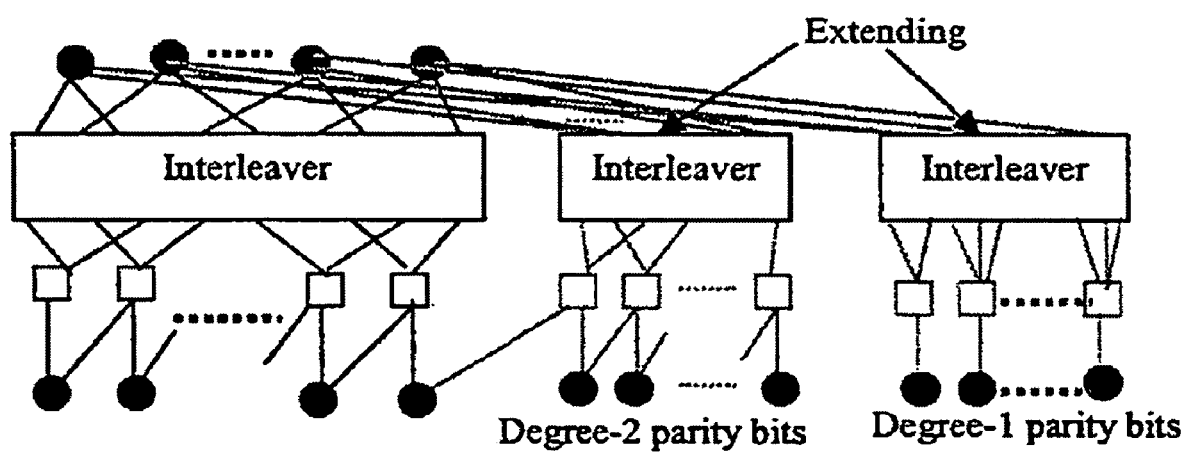
FIG. 10 is a bipartite graph representation of the extended RC-LDPC.

It has been determined that degree-1 nodes play an important role in designing low-rate codes. In particular, a massive number of degree-1 nodes are extended for an LDPC code in order to design a very low-rate code with capacity-approaching coding gain. Hence, instead of extending solely with degree-2 nodes, we propose a new extending method which includes the degree-1 parity bits to obtain RC-IRA codes at lower rates. The columns of the extended matrix $B_1$ and $B_2$ then have either two or one nonzero entry placed at the diagonal positions, as shown in the right part of FIG. 9. A bipartite graph representation of the extended code is depicted in FIG. 10. It is then natural to ask what is the optimal proportion of degree-1 and degree-2 parity nodes for extending. The solution can also be found by the density evolution analysis of iterative IRA decoding.

Define $\pi_{q,a}$ as the proportion of degree-1 nodes connected to the check nodes (including extended nodes) with grouping factor a at the qth extending stage. Hence, function $h_i$ and $\tilde{h}$ in (8) and (9) can be written as $$h_{q,i}(s, r, \tilde{r}) = \phi\left(s + (i-1)\phi^{-1}\left(1 - \sum_a \rho_{q,a}((1-\pi_{q,a}) \quad (16)\right.\right.$$
$$\left.\left. (1-r)^{a-1}(1-\tilde{r})^2 + \pi_{q,a}(1-r)^{a-1}(1-r_0))\right)\right),$$

and $$\tilde{h}_q(s, r, \tilde{r}) = \phi\left(s + \phi^{-1}\left(1 - \sum_a \tilde{p}_{q,a}(1-\pi_{q,a})(1-r)^a(1-\tilde{r})\right)\right), \quad (17)$$

where $r_0 = \phi(s)$. Here we assume that the check nodes connected to the extended degree-2 and degree-1 parity nodes have the same grouping factor at each extending stage. Define $\pi_q^*$ as the proportion of degree-1 parity nodes over the extended nodes (with total equal to $M_q - M_{q-1}$) at the qth stage. We have $$\pi_{q+1,a} = \pi_{q,a} \text{ for } a \neq a_{q+1}, \quad (18)$$

$$\pi_{q+1,a} = \beta_q \tilde{p}_{q,a} \pi_{q,a} + (1-\beta_q)\pi_{q+1}^* \text{ for } a = a_{q+1}. \quad (19)$$

It is seen that only $\pi_{q+1}^*$ is introduced to the design of the code profile at the (q+1)th extending stage ($\pi_{q+1,a}$ can be obtained from (18) and (19)). The optimization at the qth extending stage can be summarized as $$\min_{\{\lambda_{q,i}\}, a_q, \pi_q^*} E_b/N_0 \text{ s.t. } r > h(s, r, \tilde{r}), \text{ and the constraints in (15)}. \quad (20)$$

Again, the above optimization can be solved by differential evolution.

The code profile obtained from the above optimization to achieve the threshold of $E_b/N_0$ is for infinite-length random codes with cycle-free assumption. For practical applications, it might be difficult to build a good finite-length code (i.e., a few thousand bits or less) from the optimized profiles since the cycles are impossible to avoid. Under the iterative decoding, the existence of cycles causes the error-floor. The above-mentioned patent application proposes a finite-length code design method by introducing unequal protection of variable nodes with distinguishing different type of cycles in the bipartite graph representation of IRA codes. Here, we can apply the same design strategy to build an extended code matrix of $R < R_0$. Thus, in order to find the good tradeoff between low threshold decoding and low error-floors, consider the following simplifications.

Since the nodes of large degrees make the cycle control difficult to achieve when constructing a practical code matrix, it can be assumed that the edges from extended check nodes are evenly connected to the information nodes. Then there are only two consecutive components in the profile of information nodes, i.e., $\lambda_{q,i}$ and $\lambda_{q,i-1}$. Hence, we only need optimize $a_q$, $\pi_{a_q}$ since $\lambda_{q,i}$ and $\lambda_{q,i-1}$, are determined by $a_q$, given by $$\lambda_{q,i+\lceil \alpha \rceil} = \alpha - \lfloor \alpha \rfloor, \lambda_{q,i+\lfloor \alpha \rfloor} = \lceil \alpha \rceil - \alpha, \quad (21)$$

where $$\alpha = \dfrac{(a_q(M_q - M_{q-1}) - K\lambda_{q-1,i-1})}{K} \quad (22)$$
$$= a_q\left(\dfrac{1}{R_q} - \dfrac{1}{R_{q-1}}\right) - \lambda_{q-1,i-1}.$$

It is advantageous to limit the maximum possible value of a due to the same reason that large a will lead to large degrees on the information nodes which brings up difficulties on the cycle control. With this simplification, we can simply search the optimized $\pi_q^*$ for any given $a_q < a_{max}$ and find the best pair of $\pi_q^*$, $a_q$.

Define Function $$f(s, r, \tilde{r}, \pi_q^*) \triangleq h(s, r, \tilde{r}) - r, \quad (23)$$

where $h(s, r, \tilde{r})$ can be computed by (7), (16) and (17) applying the above simplification results. With error-free decoding constraint, $r > h(s, r, \tilde{r})$, we have $f(s, r, \tilde{r}, \pi) < 0$. Then given $a_q$, the profiles of the RC codes at the (q−1)th stage, and the target rate $R_q$, the optimal $\pi_q^*$ can be obtained by solving $$\min_{\pi_q^*} E_b/N_0 \quad s.t. \quad f(s, r, \tilde{r}, \pi_q^*) < 0. \quad (24)$$

Figure 11:
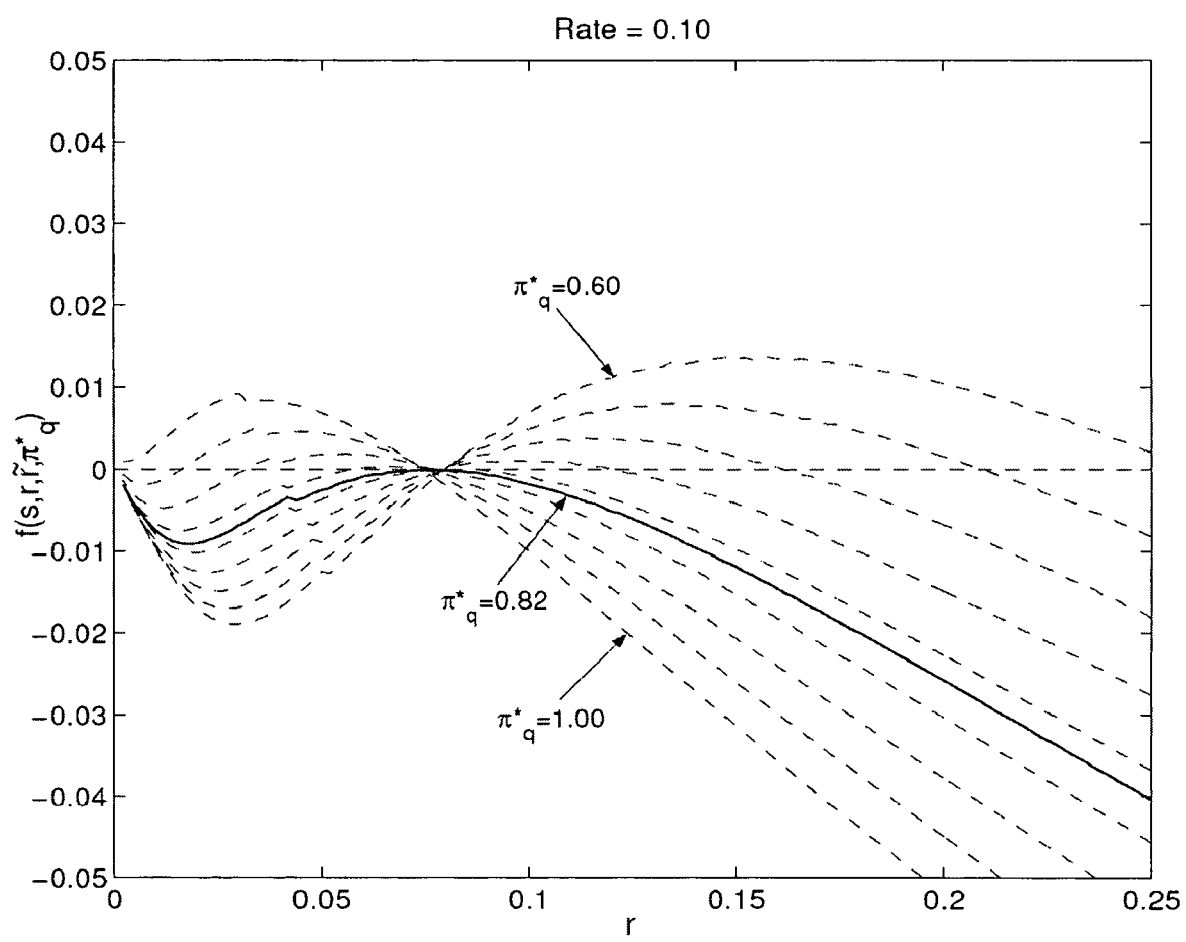
FIG. 11 is a graph illustrating function $f(s, r, \pi)$ curves of an extended LDPC code, R=0.1. The dashed lines are for $\pi$ from 0.6 to 1.0 with step 0.05.

Consider an example of extending to a very low rate, $R_q$=0.1, q=1, directly from the mother code. The mother code is obtained from finite-length LDPC design strategy with $R_0$=0.5 and profiles $\{\lambda_5=1, a=5\}$. The function $f(s, r, \tilde{r}, \pi_q^*)$ for $\pi_q^*$=0.6, 0.75, ..., 1 and $a_q$=3 is evaluated and illustrated in FIG. 11. We find that at this SNR, $E_b/N_0$=−0.83 dB, almost all the curves of $f(s, r, \tilde{r}, \pi_q^*)$ cross over the line y=0, i.e., $f(s, r, \tilde{r}, \pi_q^*)$>0, indicating the decoding will fail since error-free decoding constraint is not satisfied. The exception is the optimal result, $\pi_q^*$=0.82, which is tangent to y=0 line. If we further decrease the value of SNR, we cannot obtain any solution of $\pi_q^*$ that satisfy $f(s, r, \tilde{r}, \pi_q^*)$<0. Hence, minimum SNR is achieved and $\pi_q^*$=0.82 is the optimal result for this case.

While exemplary drawings and specific embodiments of the present invention have been described and illustrated, it is to be understood that that the scope of the present invention is not limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow and their structural and functional equivalents.

What is claimed is:

1. A method for generating rate-compatible codes for a digital data communication system that is performed by a transmitter for the transmission of data to a receiver over a wireless channel, the method comprising the steps of:
   for a given range of code rates and responsive to minimizing maximal step recoverable punctured nodes, puncturing a maximum number of parity nodes in an initial low density parity check code to obtain a first low density parity check code with a highest code rate;
   for a given range of code rates and responsive to minimizing maximal step recoverable punctured nodes, repeatedly unpuncturing at least one of the punctured parity nodes in the first low density parity check code so as to obtain a next low density parity check code with a lowest code rate lower than the highest code rate; and
   extending the initial low density parity check code with a mixture of at least one degree-1 parity node and at least one degree-2 parity node from an accumulate structure so as to obtain a second low density parity check code with a lower code rate than the lowest code rate obtained by the repeatedly unpuncturing step, wherein each of said low density parity check codes are rate-compatible and wherein the mixture is determined by optimizing the proportions of the degree-1 parity nodes and the degree-2 parity nodes in the mixture with respect to a minimum signal-to-noise ratio measure.

2. The method of claim 1 wherein the punctured parity nodes are unpunctured based on a grouping of the parity nodes based on recoverable steps.

3. The method of claim 2 wherein consecutive punctured parity nodes with a maximum recoverable step are unpunctured before other punctured parity nodes with a maximum recoverable step.

4. The method of claim 1 wherein the initial low density parity check code is an irregular repeat accumulate (IRA) code.

5. A digital data communication system which utilizes hybrid automatic repeat request (ARQ) with rate-compatible codes generated by the method of claim 1.

6. The method of claim 1, wherein the transmitter includes an encoder which encodes transmissions using the rate-compatible low density parity check codes.

7. The method of claim 1, wherein the receiver includes a decoder which decodes transmissions using the rate-compatible low density parity check codes.

8. The method of claim 1, wherein the optimized proportions are determined from density evolution analysis of the initial low density parity check code.

9. A method for generating rate-compatible codes for a digital data communication system that is performed by a transmitter for the transmission of data to a receiver over a wireless channel, the method comprising the steps of:
   generating higher-rate codes from an initial low density parity check code by puncturing a maximum number of parity nodes in the initial low density parity check code to obtain a first low density parity check code with a high code rate, and
   unpuncturing at least one of the punctured parity nodes in the first low density parity check code so as to obtain a next low density parity check code with a code rate lower than the high code rate and higher than an initial code rate; and
   generating lower-rate codes from the initial low density parity check code by extending the initial low density parity check code with a mixture of at least one degree-1 parity node and at least one degree-2 parity node from an accumulate structure so as to obtain another low density parity check code with a lower code rate than the initial code rate, wherein each of said low density parity check codes are rate-compatible and wherein the mixture is determined by optimizing the proportions of the degree-1 parity nodes and the degree-2 parity nodes in the mixture with respect to a minimum signal-to-noise ratio measure.

10. The method of claim 9 wherein the initial low density parity check code is an irregular repeat accumulate (IRA) code.

11. A digital data communication system which utilizes hybrid automatic repeat request (ARQ) with rate-compatible codes generated by the method of claim 9.

12. The method of claim 9, wherein the transmitter includes an encoder which encodes transmissions using the rate-compatible low density parity check codes.

13. The method of claim 9, wherein the receiver includes a decoder which decodes transmissions using the rate-compatible low density parity check codes.

* * * * *